(12) United States Patent
Cheon

(10) Patent No.: US 7,449,917 B2
(45) Date of Patent: Nov. 11, 2008

(54) LEVEL SHIFTING CIRCUIT FOR SEMICONDUCTOR DEVICE

(75) Inventor: Kwun-Soo Cheon, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/606,243

(22) Filed: Nov. 30, 2006

(65) Prior Publication Data

US 2007/0262790 A1    Nov. 15, 2007

(30) Foreign Application Priority Data

May 15, 2006    (KR) .................. 10-2006-0043587

(51) Int. Cl.
*H03K 19/0175*    (2006.01)
(52) U.S. Cl. .................. 326/68; 326/62; 326/63; 326/80; 326/81
(58) Field of Classification Search .................. 326/62, 326/63, 68, 80, 81; 327/333
See application file for complete search history.

(56) References Cited

U.S. PATENT DOCUMENTS

| 6,133,756 | A | 10/2000 | Kitao |
| 6,920,570 | B2 | 7/2005 | Fujimoto et al. |
| 2006/0091907 | A1* | 5/2006 | Khan .................. 326/81 |

FOREIGN PATENT DOCUMENTS

| JP | 09064709 A | 3/1997 |
| JP | 2000-353947 | 12/2000 |
| JP | 2001274674 A | 10/2001 |
| JP | 2003168969 A | 6/2003 |
| KR | 1020010105564 A | 11/2001 |

* cited by examiner

*Primary Examiner*—Rexford Barnie
*Assistant Examiner*—Thienvu V Tran
(74) *Attorney, Agent, or Firm*—Volentine & Whitt, PLLC

(57) ABSTRACT

A level shifting circuit for a semiconductor device comprises a controller, a level shifting portion, and a driving portion. The controller is adapted to level shift a power converting input signal having a first voltage level to generate a pair of control signals having different logic levels from each other. One of the pair of control signals has a second voltage level that is different from the first level. The level shifting portion is adapted to level shift an input signal having the first voltage level to generate a level shifter output signal having the second voltage level or a third voltage level depending on the respective logic levels of the pair of control signals. The driving portion is adapted to drive an output signal with the second or third voltage level based on the voltage level of the level shifter output signal.

16 Claims, 8 Drawing Sheets

V0 < V1 < V2

US 7,449,917 B2

LEVEL SHIFTING CIRCUIT FOR SEMICONDUCTOR DEVICE

BACKGROUND OF THE INVENTION

1. Field of the Invention

Embodiments of the invention relate generally to a level shifting circuit for a semiconductor device. More particularly, embodiments of the invention relate to a level shifting circuit adapted to reduce the cost and testing time required to produce the semiconductor device.

A claim of priority is made to Korean Patent Application No. 2006-43587, filed May 15, 2006, the disclosure of which is hereby incorporated by reference in its entirety.

2. Description of Related Art

As the degree of integration and performance of modern semiconductor devices such as microprocessors continues to increase, the power level required to operate these devices tends to decrease accordingly. As a result, in some semiconductor devices, different power levels are required for different components. In addition, these semiconductor devices may also include both analog and digital components that make use of the different power levels. Examples of such devices include high speed digital communication systems, high resolution high speed displays, and high capacity data storage systems, to name but a few.

In order to provide the different power levels to the different components, modern semiconductor devices often include level shifting circuit(s) adapted to modify a power supply signal according to the requirements of the different components.

As an example, FIG. 1 illustrates a conventional level shifting circuit for a semiconductor device. The level shifting circuit of FIG. 1 comprises a level shifting portion 10 and a driving portion 20. Level shifting portion 10 comprises a power voltage selecting portion 11 and a level shifter 12, and driving portion 20 comprises first and second driving units 21 and 22.

Power voltage selecting portion 11 receives first and second power voltages V1 and V2, which have different voltage levels. Power voltage selecting portion 11 selects one of power voltages V1 and V2 and outputs the selected power voltage as a level shifter power voltage LS_P.

Level shifter 12 receives level shifter power voltage LS_P and an input signal VIN and modifies the level of input signal VIN according to level shifter power voltage LS_P to produce a level shifter output signal LS_OUT. For example, where level shifter power voltage LS_P is generated as power voltage V1, level shifter 12 modifies input signal VIN according to the level of power voltage V1 to generate level shifter output signal LS_OUT.

Driving portion 20 receives level shifter power voltage LS_P from power voltage selecting portion 11 and level shifter output signal LS_OUT from level shifter 12 and delays and amplifies level shifter output signal LS_OUT under the control of level shifter power voltage LS_P to produce a power voltage output signal VOUT.

To provide different components in the semiconductor device with different operating voltages, power voltage selecting portion 11 controls the level of input signal VIN based on first and second power voltages V1 and V2. However, in order to provide first and second power voltages V1 and V2 to level shifter 12, power voltage selecting portion 11 generally requires a separate metal layer and a separate semiconductor well region for each of the first and second power voltages V1 and V2. Unfortunately, the additional metal layer and semiconductor well region add to the time and cost required to manufacture and test power voltage selecting unit.

The operation of level shifter 12 and driving portion 20 is explained in further detail below with reference to FIGS. 2 and 3, respectively.

FIG. 2 is a circuit diagram illustrating a conventional implementation of level shifter 12. Referring to FIG. 2, the level shifter includes negative metal-oxide semiconductor (NMOS) transistors N1, N2, N3, and N4, positive metal-oxide semiconductor (PMOS) transistors P1 and P2, and an inverter INV.

Level shifter power voltage LS_P is applied to respective upper terminals of PMOS transistors P1 and P2 and the respective gates of NMOS transistors N1 and N3. NMOS transistor N1 is connected between first PMOS transistor P1 and NMOS transistor N2. NMOS transistor N2 is connected between NMOS transistor N1 and ground. NMOS transistor N3 is connected between PMOS transistor P2 and NMOS transistor N4. NMOS transistor N4 is connected between NMOS transistor N3 and ground.

Input signal VIN is applied to the gate of NMOS transistor N2, and the input of inverter INV. Inverter INV inverts input signal VIN to produce an inverted input signal /VIN and applies inverted input signal/VIN to the gate of NMOS transistor N4. The gate of PMOS transistor P1 is connected to a lower terminal of PMOS transistor P2 to form a second output terminal T2 of level shifter 12, and the gate of PMOS transistor P2 is connected to a lower terminal of PMOS transistor P1 to form a first output terminal T1. Output signal LS_OUT is apparent at first output terminal T1.

Level shifter power voltage LS_P is applied to the respective gates of NMOS transistors N1 and N3 to turn on NMOS transistors N1 and N3.

Where input signal VIN has a logic level "low", NMOS transistor N2 is turned off and NMOS transistor N4 is turned on. As a result, the voltage level of second output terminal T2 is pulled to ground VSS and PMOS transistor P1 is turned on. Accordingly, first output terminal T1 assumes level shifter power voltage LS_P and PMOS transistor P2 is turned off. Since the voltage level of output terminal T1 is level shifter power voltage LS_P, level shifter power voltage LS_P level is output from first output terminal T1 as output signal LS_OUT.

On the other hand, where input signal VIN has a logic level "high", NMOS transistor N2 is turned on, and NMOS transistor N4 is turned off. As a result, the voltage level of first output terminal T1 is pulled to ground VSS and PMOS transistor P2 is turned on. Accordingly, second output terminal T2 assumes level shifter power voltage LS_P and PMOS transistor P1 is turned off. Since first output terminal T1 is pulled to ground VSS, ground VSS is output from first output terminal T1 as output signal LS_OUT.

FIG. 3 is a circuit diagram illustrating one conventional implementation of driving portion 20, including first and second driving units 21 and 22.

Referring to FIG. 3, first driving circuit 21 comprises a PMOS transistor P3 and NMOS transistors N7 and N9 which are serially connected to each other. Level shifter power voltage LS_P is applied to the an upper terminal of PMOS transistor P3 and the gate of NMOS transistor N7. First output terminal T1 of level shifter 12 is connected to the respective gates of PMOS transistor P3 and NMOS transistor N9. An output terminal of first driving circuit 21 is formed at a connection point between NMOS transistor N7 and PMOS transistor P3.

Second driving circuit 22 has a similar configuration to first driving circuit 21. In second driving circuit 22, the output terminal of first driving circuit 21 is connected to the respective gates of a PMOS transistor P4 and a NMOS transistor N10. An output terminal of second driving circuit 22 is formed at a connection point between PMOS transistor P4 and NMOS transistor N10. Power voltage output signal VOUT of level shifting circuit 12 is output through the output terminal of second driving circuit 22.

The basic operation of level shifting circuit 12 is explained below in still further detail with reference to FIGS. 1 through 3.

Power voltage selecting portion 11 selects between first and second power voltages V1 and V2. For explanation purposes, it will be assumed that second power voltage V2 has a higher level than first power voltage V1. Power voltage selection circuit 11 then outputs the selected power voltage as level shifter power voltage LS_P. Level shifter 12 and first and second driving units 21 and 22 operate according to level shifter power voltage LS_P and produce power voltage output signal VOUT.

Where level shifter power voltage LS_P is commonly applied to the respective gates of NMOS transistors N1 and N3 in level shifter 12 and to the respective gates of NMOS transistors N7 and N8 in first and second driving circuits, NMOS transistors N1, N3, N7, and N8 are turned on.

Thus, where input signal VIN has logic level "low", level shifter power voltage LS_P level is output from first output terminal T1 of level shifter 12, and ground VSS is output from second output terminal T2 of level shifter 12.

The output of first output terminal T1 having level shifter power voltage LS_P is applied to the respective gates of PMOS transistor P3 and NMOS transistor N9 to turn off PMOS transistor P3 and to turn on NMOS transistor N9. As a result, ground VSS is output from the output terminal of first driving circuit 21. The output of first driving circuit 21 is applied to the respective gates of PMOS transistor P4 and NMOS transistor N10 to turn on PMOS transistor P4 and to turn off NMOS transistor N10. As a result, level shifter power voltage LS_P level is output from the output terminal of second driving circuit 22.

Where input signal VIN has logic level "high", ground VSS is output from first output terminal T1 of level shifter 12 and level shifter power voltage LS_P is output from second output terminal T2 of level shifter 12.

The voltage level of first output terminal T1 is applied to the respective gates of PMOS transistor P3 and NMOS transistor N9 to turn on PMOS transistor P3 turned on and to turn off NMOS transistor N9. As a result, level shifter power voltage LS_P level is output from the output terminal of first driving circuit 21. The output of first driving circuit 21 is applied to the respective gates of PMOS transistor P4 and NMOS transistor N10 to turn off PMOS transistor P4 and to turn on NMOS transistor N10. As a result, ground VSS is output from the output terminal of second driving circuit 22.

As described above, one of the unfortunate drawbacks of the conventional level shifting circuit is that a plurality of metal layers must be formed to provide the power supply signal with multiple different levels. This tends to increase the cost and time required to manufacture and test the level shifting circuit. In addition, once the level shifting circuit is completed, it is not possible to change the number of different levels with which the power supply signal can be supplied because the number of metal layers in the level shifting circuit cannot be dynamically changed.

SUMMARY OF THE INVENTION

In recognition of at least the above limitations of conventional level shifting circuits, selected embodiments of the invention provide level shifting circuits adapted to reduce the cost and testing time required to produce semiconductor devices.

According to one embodiment of the invention, a level shifting circuit for a semiconductor device comprises a controller, a level shifting portion, and a driving portion. The controller is adapted to level shift a power converting input signal having a first voltage level to generate a pair of control signals having different logic levels from each other, wherein one of the pair of control signals has a second voltage level that is different from the first level. The level shifting portion is adapted to level shift an input signal having the first voltage level to generate a level shifter output signal having the second voltage level or a third voltage level depending on the respective logic levels of the pair of control signals. The driving portion is adapted to drive an output signal with the second or third voltage level based on the voltage level of the level shifter output signal.

BRIEF DESCRIPTION OF THE DRAWINGS

Embodiments of the invention are described in relation to the accompanying drawings. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims.

Figure 4:
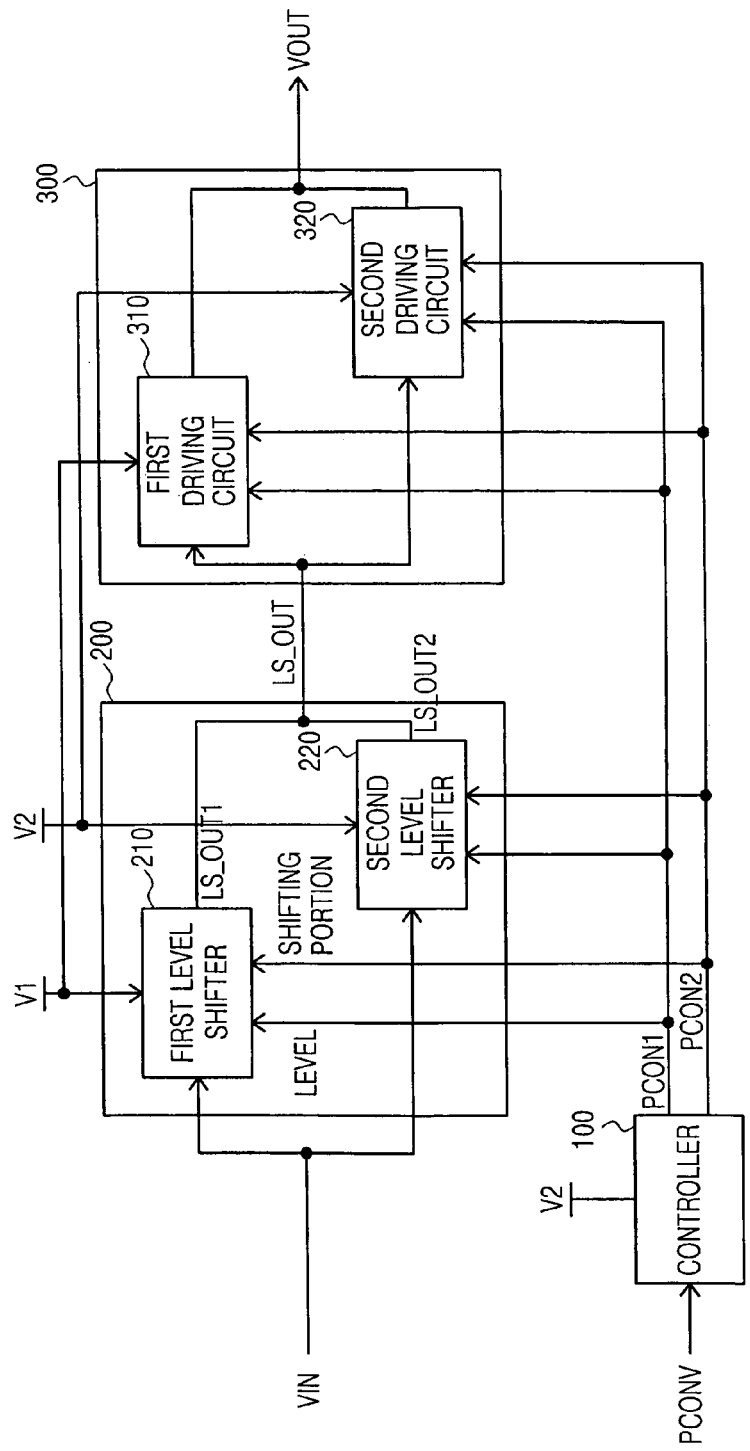
FIG. 4 is a circuit diagram illustrating a level shifting circuit for a semiconductor device according to an exemplary embodiment of the present invention.

FIG. 4 is a circuit diagram illustrating a level shifting circuit for a semiconductor device according to an exemplary embodiment of the present invention. The term "level shift" is used throughout this written description to describe an operation whereby the voltage level of a signal is "shifted" (i.e., increased or decreased) to another level.

Referring to FIG. 4, the level shifting circuit comprises a controller 100, a level shifting portion 200, and a driving portion 300. Level shifting portion 200 comprises level shifters 210 and 220, and driving portion 300 comprises driving circuits 310 and 320.

The operation of various components in the level shifting circuit of FIG. 4 are explained below.

Controller 100 receives a power converting input signal PCONV and a second power voltage V2 and outputs first and second power voltage control signals PCON1 and PCON2, which are used to control the operation of level shifting portion 200 and driving portion 300. First and second power voltage control signals have opposite "phases," or logic levels from each other.

First power voltage control signal PCON1 is used to select first level shifter 210 and second power voltage control signal PCON2 is used to select second level shifter 220. First and second level shifters 210 and 220 receive respective first and second voltages V1 and V2 and increase or decrease the voltage level of an input signal VIN to produce a level shifter output signal LS_OUT.

First power voltage control signal PCON1 is also used to select first driving circuit 310 and second power voltage control signal PCON2 is also used to select second driving circuit 320. First and second driving circuits 310 and 320 receive respective first and second power voltages V1 and V2 and delay and amplify level shifter output signal LS_OUT to produce a power voltage output signal VOUT.

In this example, it will be assumed that second power voltage V2 is greater than first power voltage V1 and first power voltage V1 is greater than input signal VIN. Second power voltage V2 is set to be greater than first power voltage V1 to prevent counter flow of electric current into first or second level shifter 210 or 220.

Figure 5:
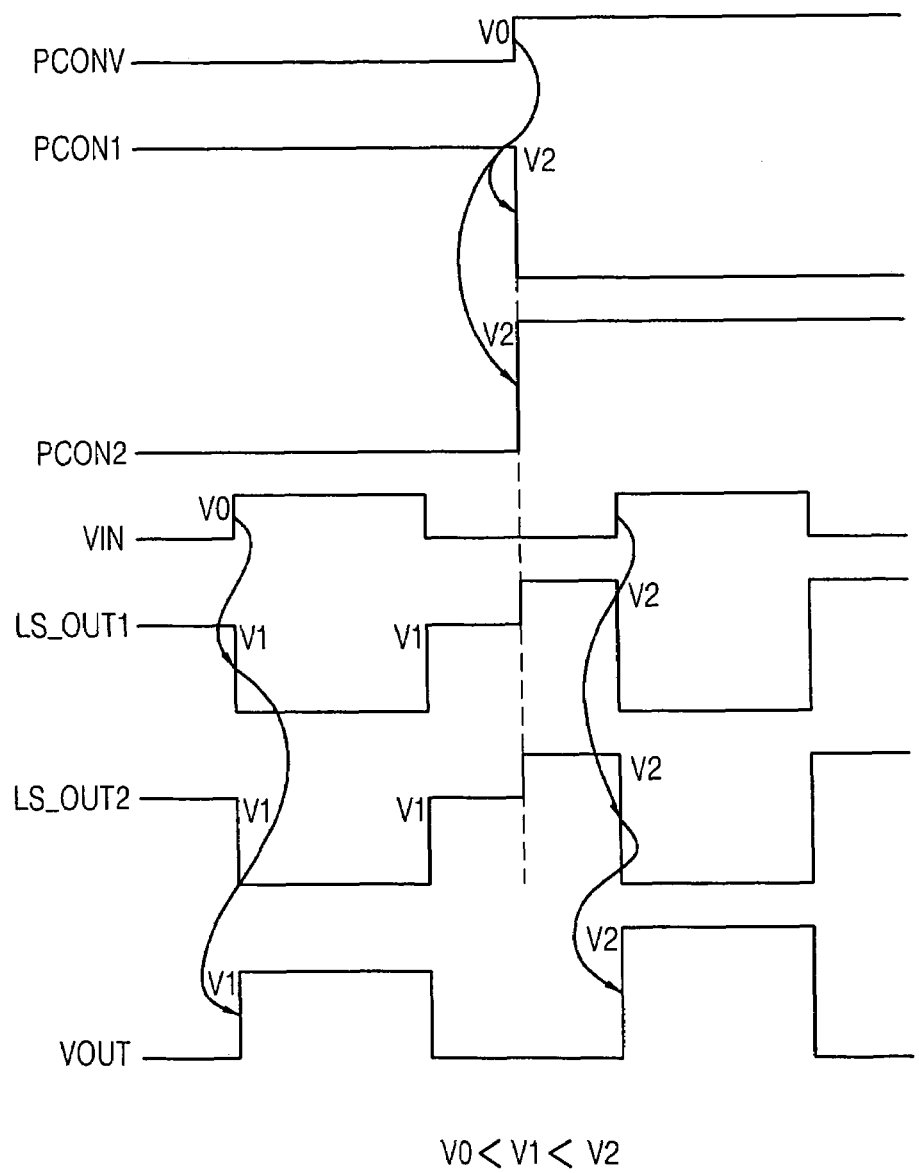
FIG. 5 a timing diagram illustrating an operation of the level shifting circuit of FIG. 4.

FIG. 5 is a timing diagram illustrating the operation of the level shifting circuit in FIG. 4. As illustrated by FIG. 5, the distinctions "logic level 'low'" and "logic level 'high'" may correspond to different voltage levels for different signals. In other words, these distinctions correspond to relative levels of a signal.

In FIG. 5, the waveform labeled PCONV represents the voltage level of power converting input signal PCONV, the waveform labeled PCON1 denotes the voltage level of first power voltage control signal PCON1, the waveform labeled PCON2 denotes the voltage level of second power voltage control signal PCON2, the waveform labeled VIN denotes the voltage level of input signal VIN, the waveform labeled LS_OUT1 denotes the voltage level of the output of first level shifter 210, the waveform labeled LS_OUT2 denotes voltage level of the output of second level shifter 220, and the waveform labeled VOUT denotes the voltage level of power voltage output signal VOUT Referring to FIG. 5, the respective logic levels of first and second power voltage control signals PCON1 and PCON2 are controlled by the logic level of power converting signal PCONV. In particular, as seen in FIG. 5, where power converting signal PCONV has logic level "low", first power voltage control signal PCON1 has logic level "high" and second power voltage control signal PCON2 has logic level "low". Conversely, where power converting signal PCONV has logic level "high", first power voltage control signal PCON1 has logic level "low" and second power voltage control signal PCON2 has logic level "high".

The logic level of power converting signal PCONV may be controlled in a variety of ways. For example, in one embodiment, power converting signal PCONV comprises a mode register set (MRS) control signal having a logic state based on the value of a data bit stored in a mode register. In another embodiment, the logic level of power converting input signal PCONV is determined based on the state of a fuse. For example, where the fuse is connected, the logic level of power converting input signal PCONV is logic level "low", and where the fuse is blown, the logic level of power converting input signal PCONV is logic level "high". In still another embodiment, the logic level of power converting input signal PCONV is determined by a mode of the semiconductor device such as an active mode, an inactive mode, a read mode, a write mode, and a pre-charge mode.

For example, in the pre-charge mode, a bit line equalizer may drive power converting input signal PCONV with an internal voltage. In the active mode, the bit line equalizer may drive power converting input signal PCONV with an external voltage VPP, or in the inactive mode, with ground VSS. The logic state of power converting input signal PCONV may be converted so that a local global input/output controller can select an external voltage using a signal of the read mode, select a VPP voltage using a signal of the write mode, and select the ground voltage using a signal of the pre-charge mode.

Controller 100 outputs first and second power voltage control signals PCON1 and PCON2 with logic levels based on the logic level of power converting input signal PCONV as described above. Where first power voltage control signal PCON1 has logic level "high", level shifting portion 200 and driving portion 300 select first level shifter 210 and first driving circuit 310, respectively, and where second power voltage control signal PCON2 has logic level "high", level shifting portion 200 and driving portion 300 select second level shifter 220 and second driving circuit 320, respectively.

For example, where power converting input signal PCONV has logic level "low", first power voltage control signal PCON1 has logic level "high", and second power voltage control signal PCON2 has logic level "low". As a result, first level shifter 210 is selected to change the level of input signal VIN to first power voltage V1. Input signal VIN is then output as first level shifter output signal LS_OUT1. First driving circuit 310 then delays and amplifies first level shifter output signal LS_OUT1 to generate power voltage output signal VOUT Where power converting input signal PCONV has logic level "high", first power voltage control signal PCON1 has logic level "low" and second power voltage control signal PCON2 has logic level "high". As a result, second level shifter 210 is selected to change the level of input signal VIN to second power voltage V2. Input signal VIN changed to second power voltage V2 is then output as second level shifter output signal LS_OUT2. Second driving circuit 320 receives, delays, and amplifies second level shifter output signal LS_OUT2 to generate an inverted data value as power voltage output signal VOUT.

Figure 6:
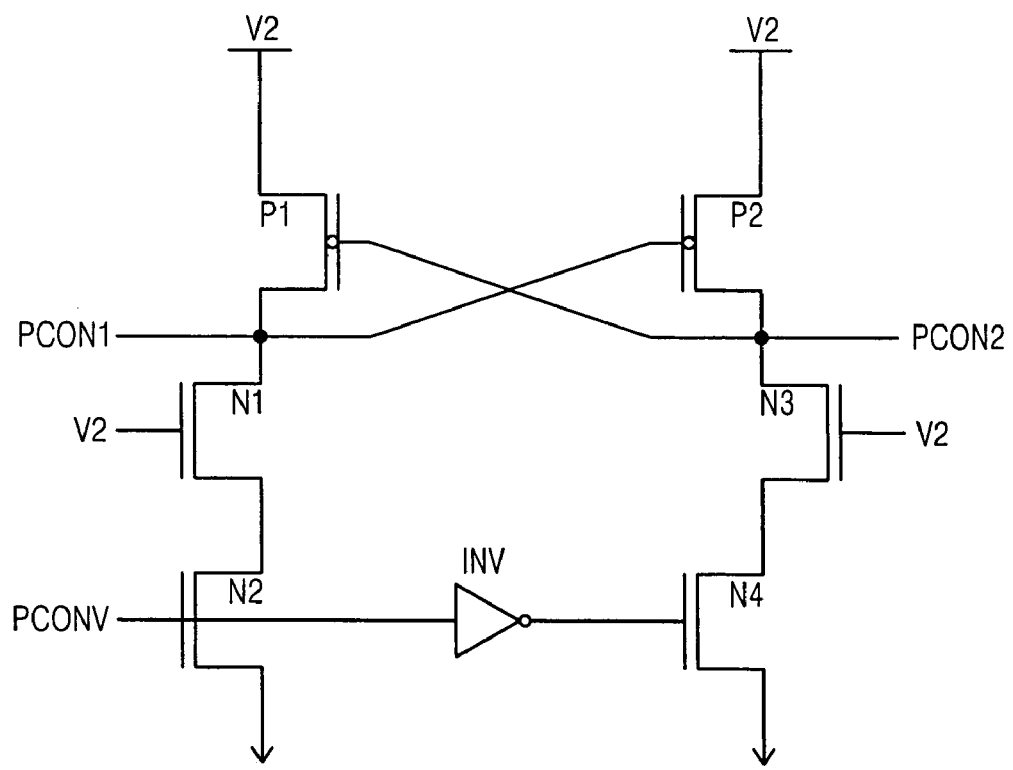
FIG. 6 is a circuit diagram illustrating a controller used in the level shifting circuit of FIG. 4.

FIG. 6 is a circuit diagram illustrating one possible implementation of controller 100 according to an exemplary embodiment of the present invention. Controller 100 of FIG. 6 has a similar configuration to level shifter 12 shown in FIG. 2, except that in controller 100 illustrated in of FIG. 6, level shifter power voltage LS_P is replaced by second power voltage V2 and input signal VIN is replaced by power converting input signal PCONV. In addition, first and second output terminals T1 and T2 of level shifter 12 are relabeled to indicate that they correspond to first and second power voltage control signals PCON1 and PCON2, respectively.

Figure 1:
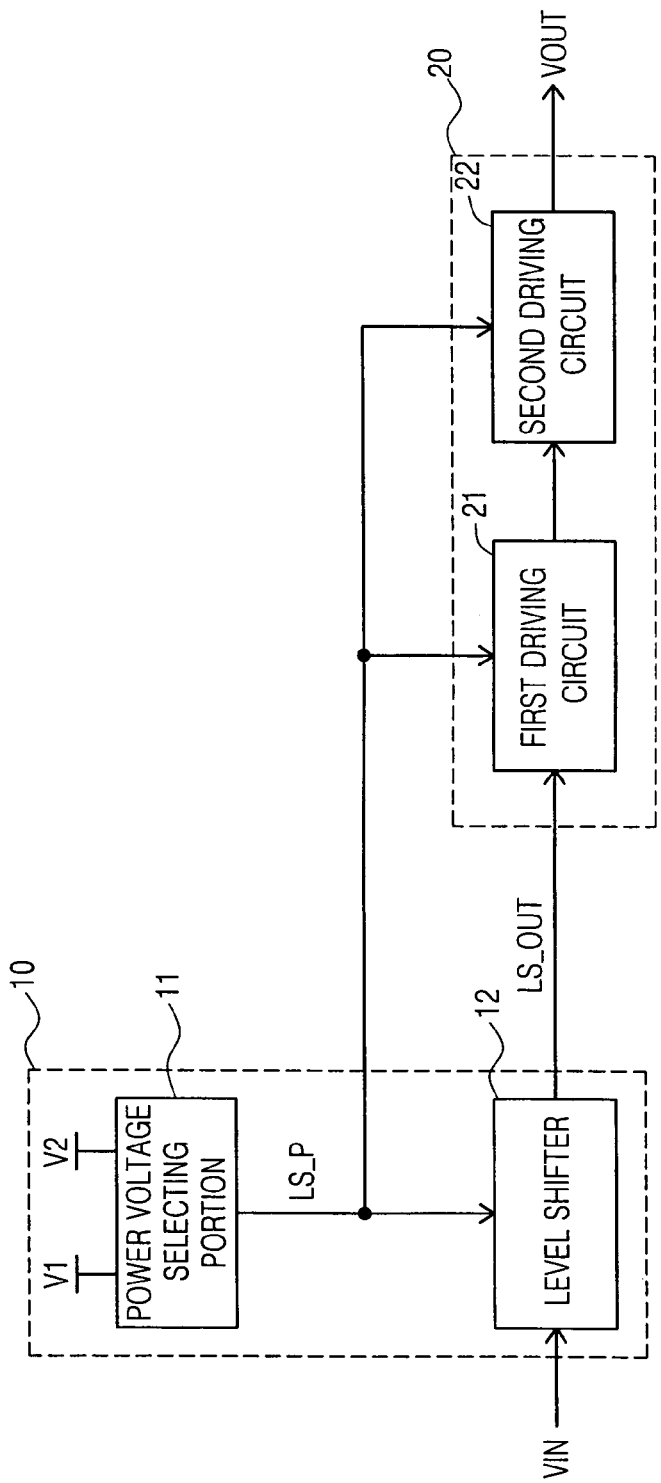
FIG. 1 is a block diagram illustrating a conventional level shifting circuit for a semiconductor device.
Figure 2:
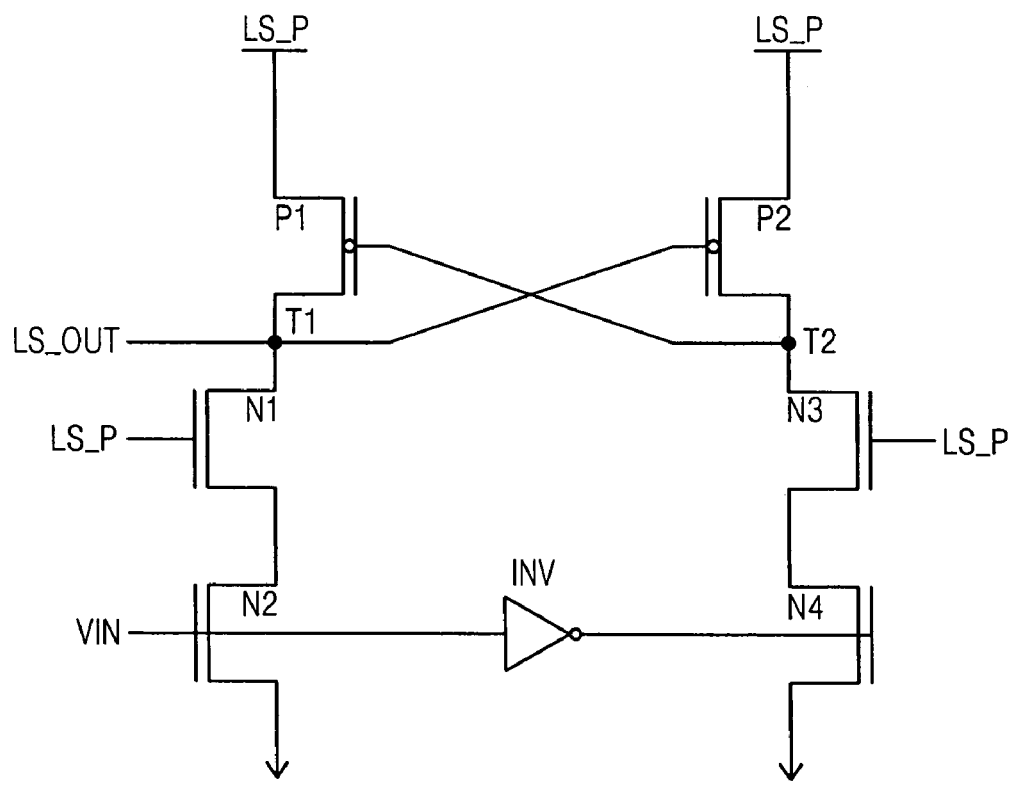
FIG. 2 is a circuit diagram illustrating a level shifter used in the conventional level shifting circuit.
Figure 3:
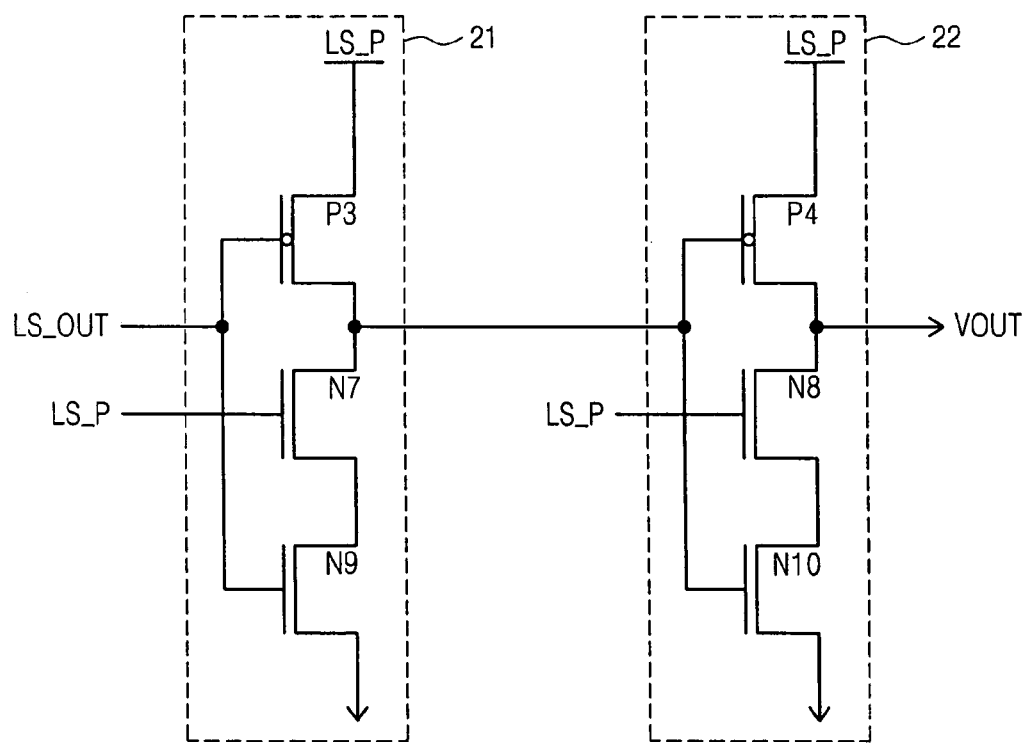
FIG. 3 is a circuit diagram illustrating a driving portion of the conventional level shifting circuit.

Controller 100 shown in FIG. 6 operates similar to level shifter 12 of FIG. 2, and therefore a detailed description thereof is omitted to avoid redundancy.

Where power converting input signal PCONV has logic level "low", second power voltage V2 is output as first power voltage control signal PCON1 and ground VSS is output as second power voltage control signal PCON2.

On the other hand, where power converting input signal PCONV has logic level "high", ground VSS is output as first power voltage control signal PCON1 and second power voltage V2 is output as second power voltage control signal PCON2.

Figure 7:
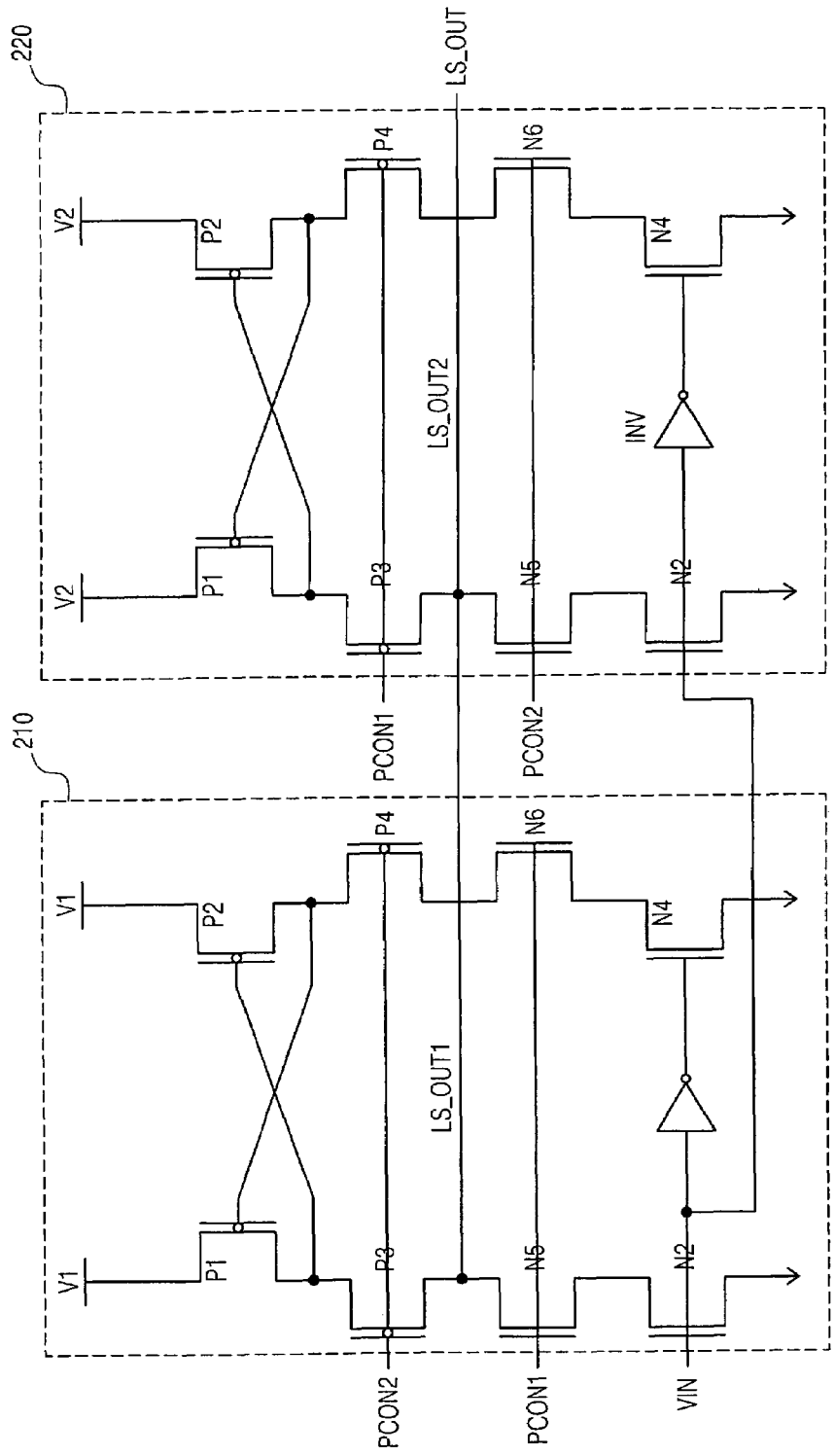
FIG. 7 is a circuit diagram illustrating a level shifting portion in the level shifting circuit of FIG. 4.

FIG. 7 is a circuit diagram illustrating an implementation of level shifting portion 200 according to an exemplary embodiment of the present invention.

Referring to FIG. 7, first level shifter 210 comprises PMOS transistors P1, P2, P3, and P4 and NMOS transistors N2, N4, N5, and N6. Respective upper terminals of PMOS transistors P1 and P2 are connected to first power voltage V1. The gate of PMOS transistor P1 is connected to a lower terminal of PMOS transistor P2 and the gate of PMOS transistor P2 is connected to a lower terminal of PMOS transistor P1. PMOS transistor P3 is connected between PMOS transistor P1 and NMOS transistor N5, NMOS transistor N5 is connected between PMOS transistor P3 and NMOS transistor N2, and NMOS transistor N2 is connected between NMOS transistor N5 and ground. PMOS transistor P4 is connected between PMOS transistor P2 and NMOS transistor N6, NMOS transistor N6 is connected between PMOS transistor P4 and NMOS transistor N4, and NMOS transistor N4 is connected between NMOS transistor N6 and ground.

The respective gates of PMOS transistors P3 and P4 are connected to second power voltage control signal PCON2 and the respective gates of NMOS transistors N5 and N6 are connected to first power voltage control signal PCON1. The gate of NMOS transistor N2 is connected to input signal VIN. Input signal VIN is inverted to produce an inverted input signal /VIN, and the gate of NMOS transistor N4 is connected to inverted input signal /VIN.

Second level shifter 220 is similar to first level shifter 210, and therefore the same labels have been applied to similarly configured components such as PMOS transistors P1, P2, P3, and P4 and NMOS transistors N2, N4, N5, and N6.

In second level shifter 220, the upper terminals of PMOS transistors P1 and P2 are connected to second power voltage V2. The respective gates of PMOS transistors P3 and P4 are connected to first power voltage control signal PCON1 and the respective gates of NMOS transistors N5 and N6 are connected to second power voltage control signal PCON2. The gate of NMOS transistor N2 is connected to input signal VIN. Input signal VIN is inverted to produce an inverted input signal /VIN, and the gate of NMOS transistor N4 is connected to inverted input signal /VIN.

The respective outputs LS_OUT1 and LS_OUT2 of first and second level shifters 210 and 220 are provided at respective connections between the respective PMOS transistors P3 and the respective NMOS transistors N5 in respective first and second level shifters 210 and 220. The outputs LS_OUT1 and LS_OUT2 are connected to each other to drive level shifter output signal LS_OUT so that where first level shifter 210 is selected, level shifter output signal LS_OUT is driven with first power voltage V1 and where second level shifter 220 is selected, level shifter output signal LS_OUT is driven with second power voltage V2.

Figure 8:
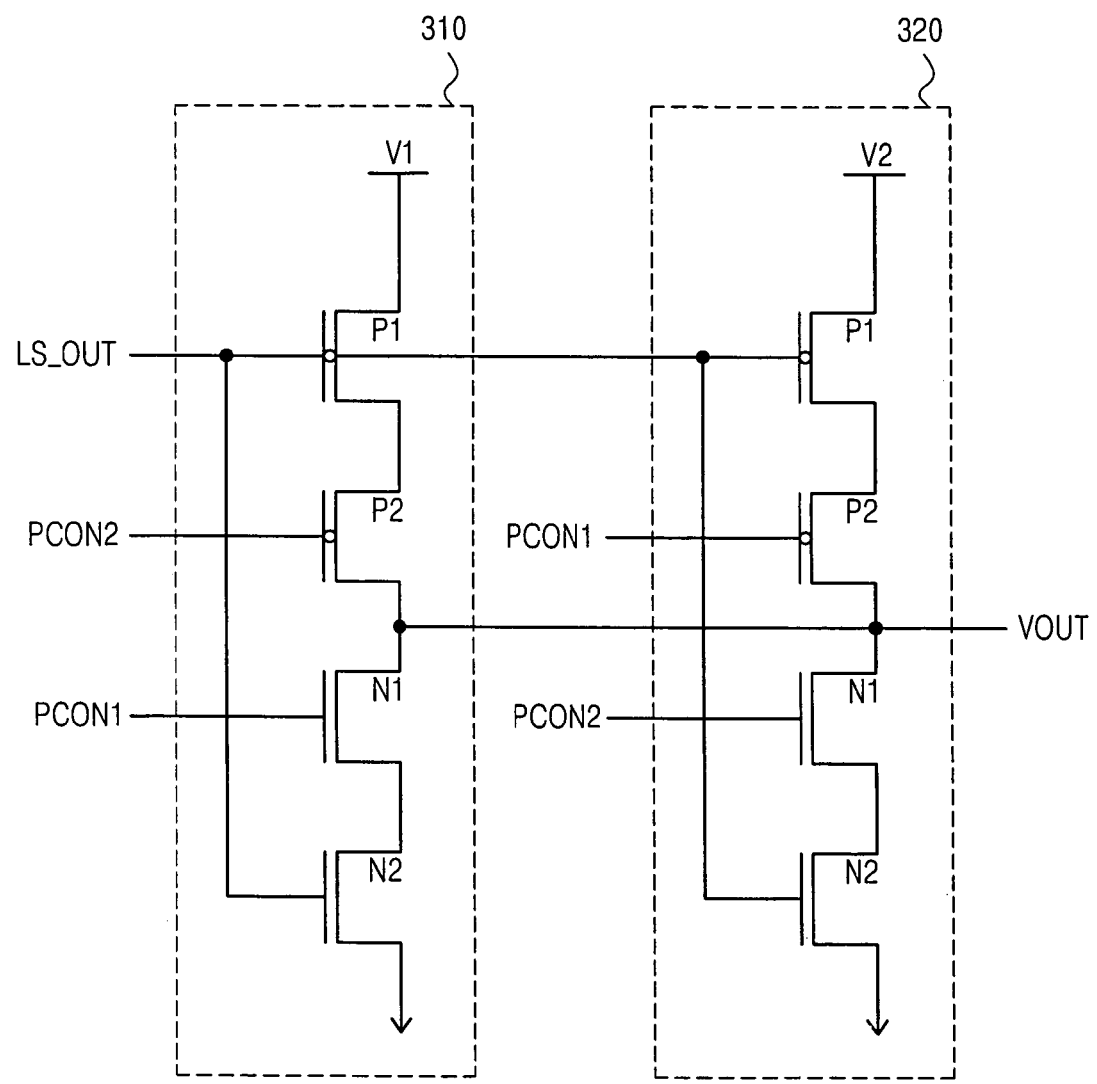
FIG. 8 is a circuit diagram illustrating a driving portion in the level shifting circuit of FIG. 4.

FIG. 8 is a circuit diagram illustrating one implementation of driving portion 300 according to the exemplary embodiment of the present invention. Driving portion 300 of FIG. 8 comprises first and second driving circuits 310 and 320.

Referring to FIG. 8, first driving circuit 310 comprises PMOS transistors P1 and P2 and NMOS transistors N1 and N2. PMOS transistor P1 is connected between power voltage V1 and PMOS transistor P2. PMOS transistor P2 is connected between PMOS transistor P1 and NMOS transistor N1. NMOS transistor N1 is connected between PMOS transistor P1 and NMOS transistor N2. NMOS transistor N2 is connected between NMOS transistor N1 and ground.

In first driving circuit 310, the respective gates of PMOS transistor P1 and NMOS transistor N2 are connected to level shifter output signal LS_OUT, the gate of PMOS transistor P2 is connected to second power voltage control signal PCON2, and the gate of NMOS transistor N1 is connected to first power voltage control signal PCON1.

Second driving circuit 320 is similar to first driving circuit 310, except that in second driving circuit 320, the gate of PMOS transistor P2 is connected to first power voltage control signal PCON1 and the gate of NMOS transistor N1 is connected to second power voltage control signal PCON2.

Power voltage output signal VOUT is provided at a terminal connected between respective NMOS transistors N1 and respective PMOS transistors P2 in first and second driving circuits 310 and 320, such that power voltage output signal VOUT can be alternately driven by first and second driving circuits 310 and 320.

The operation of level shifting portion 200 is explained in further detail below with reference to FIGS. 6 and 7.

Where power converting input signal PCONV has logic level "low", first power voltage control signal PCON1 assumes second power voltage V2 and second power voltage control signal PCON2 is pulled to ground VSS. First power voltage control signal PCON1 is applied to the respective gates of NMOS transistors N5 and N6 in first level shifter 210 to turn them on and second power voltage control signal PCON2 is applied to the respective gates of PMOS transistors P3 and P4 in first level shifter 210 to turn them on. Similarly, second power voltage control signal PCON2 is applied to the respective gates of NMOS transistors N5 and N6 in second level shifter 220 to turn them off and second power voltage control signal PCON2 is applied to the respective gates of PMOS transistors P3 and P4 in second level shifter 220 to turn them off.

In this state, where input signal VIN has logic level "low", the output LS_OUT1 of first level shifter 210 is driven by first power voltage V1. Where power converting input signal PCONV transitions from logic level "low" to logic level "high", the output LS_OUT1 of first level shifter 210 is pulled to ground VSS.

Where power converting input signal PCONV has logic level "high", first power voltage control signal PCON1 is pulled to ground and second power voltage control signal PCON2 assumes second power voltage V2. First power voltage control signal PCON1 is applied to the respective gates of NMOS transistors N5 and N6 in first level shifter 210 to turn them off and second power voltage control signal PCON2 is applied to the respective gates of PMOS transistors P3 and P4 in first level shifter 210 to turn them off. Similarly, second power voltage control signal PCON2 is applied to the respective gates of NMOS transistors N5 and N6 in second level shifter 220 to turn them on and second power voltage control signal PCON2 is applied to the respective gates of PMOS transistors P3 and P4 in second level shifter 220 to turn them on. In this state, where VIN has logic level "low", the output LS_OUT2 of second level shifter 220 is driven by second power voltage V2.

The operation of driving portion 300 is explained in further detail below with reference to FIGS. 7 and 8.

Where power converting input signal PCONV has logic level "low", first power voltage control signal PCON1 assumes second power voltage V2 level and second power voltage control signal PCON2 is pulled to ground VSS. First and second power voltage control signals PCON1 and PCON2 are respectively applied to the gate of NMOS transistor N1 and the gate of PMOS transistor P2 in first driving circuit 310 to turn them on, and first and second power voltage control signals PCON1 and PCON2 are respectively applied to the gate of PMOS transistor P2 and the gate of NMOS transistor N1 in second driving circuit 320 to turn them off. As a result, power voltage output signal VOUT is driven with first power voltage V1 where input signal VIN applied to first level shifter 210 has logic level "low", and power voltage output signal VOUT is pulled to ground VSS where input signal VIN applied to first level shifter 210 has logic level "high".

Output signal LS_OUT is applied to the gate of PMOS transistor P1 and the gate of NMOS transistor N2 in first driving circuit 310 to turn them on before ground voltage VSS or first power voltage V1 is output as power voltage output signal VOUT Where power converting input signal PCONV has logic level "high", first power voltage control signal PCON1 is pulled to ground VSS and second power voltage control signal PCON2 is driven with second power voltage V2. First and second power voltage output signals PCON1 and PCON2 are respectively applied to the gate of NMOS transistor N1 and the gate of PMOS transistor P2 in first driving circuit 310 to turn them off, and first and second power voltage output signals PCON1 and PCON2 are respectively applied to the gate of PMOS transistor P2 and the gate of NMOS transistor N1 in second driving circuit 320 to turn them on.

Where input signal VIN applied to the first level shifter 210 has logic level "low", second power voltage V2 is output from second level shifter 220 as the signal LS_OUT2. On the other hand, where input signal VIN applied to first level shifter 210 has logic level "high", ground VSS is output from second level shifter 220 as the signal LS_OUT2. Level shifter output signal LS_OUT is applied to the gate of PMOS transistor P1 and the gate of NMOS transistor N2 in second driving circuit 320 to turn them on before ground VSS or second power voltage V2 is output as power voltage output signal VOUT.

As described above, by using a plurality of transistors functioning as switches in controller 100, level shifting portion 200 and driving portion 300, first and second power voltages V1 and V2 and ground VSS can be efficiently generated in the semiconductor device.

In selected embodiments of the invention, one driving circuit is arranged in driving portion 300 so that power voltage output signal VOUT and input signal VIN have the same phase. However, a plurality of driving circuits may be arranged in driving portion 300 so that power voltage output signal VOUT and input signal VIN may have different (e.g., opposite) phases. For example, using an odd number of driving circuits can cause the phase of voltage output signal VOUT and input signal VIN to be opposites.

As described above, level shifting circuits according to selected embodiments of the invention have advantages over conventional level shifting circuits in terms of manufacturing cost and testing time and cost.

The foregoing exemplary embodiments are presented as teaching examples. Those of ordinary skill in the art will understand that various changes in form and details may be made to the exemplary embodiments without departing from the scope of the invention as defined by the claims.

What is claimed is:

1. A level shifting circuit for a semiconductor device, comprising:
a controller adapted to level shift a power converting input signal having a first voltage level to generate a pair of control signals having different logic levels from each other, wherein one of the pair of control signals has a second voltage level that is different from the first level;
a level shifting portion adapted to level shift an input signal having the first voltage level to generate a level shifter output signal having the second voltage level or a third voltage level depending on the respective logic levels of the pair of control signals, wherein the level shifting portion comprises a first level shifter receiving a first power voltage and the pair of control signals and a second level shifter receiving a second power voltage different from the first power voltage and the pair of control signals; and,
a driving portion adapted to drive an output signal with the second or third voltage level based on the voltage level of the level shifter output signal.

2. The level shifting circuit of claim 1, wherein the first voltage level is lower than the third voltage level, and the third voltage level is lower than the second voltage level.

3. The level shifting circuit of claim 1, wherein the pair of control signals comprises first and second control signals, and the controller comprises:
a first positive metal-oxide semiconductor (PMOS) transistor having a first terminal receiving the second voltage level, a second terminal, and a gate;
a first negative metal-oxide semiconductor (NMOS) transistor having a first terminal connected to the second terminal of the first PMOS transistor, a second terminal, and a gate receiving the second voltage level;
a second NMOS transistor having a first terminal connected to the second terminal of the first NMOS transistor, a second terminal connected to ground, and a gate receiving the power converting input signal;
an inverter receiving the power converting input signal and outputting an inverted power converting input signal;
a second PMOS transistor having a first terminal receiving the second voltage level, a second terminal connected to the gate of the first PMOS transistor, and a gate connected to the second terminal of the first PMOS transistor;
a third NMOS transistor having a first terminal connected to the second terminal of the second PMOS transistor, a second terminal, and a gate receiving the second voltage level;
a fourth NMOS transistor having a first terminal connected to the second terminal of the third NMOS transistor, a second terminal connected to ground, and a gate receiving the inverted power converting input signal;
wherein the first control signal is a signal apparent at the second terminal of the first PMOS transistor and the second control signal is a signal apparent at the second terminal of the second PMOS transistor.

4. The level shifting circuit of claim 1, wherein the
first level shifter is adapted to level-shift the input signal to generate a first level shifting signal having the third level in response to the pair of control signals; and
the second level shifter is adapted to level-shift the input signal to generate a second level shifting signal having the second level in response to the pair of control signals.

5. The level shifting circuit of claim 4, wherein the first level shifter comprises:
first and second positive metal-oxide semiconductor (PMOS) transistors, each having a source receiving the third voltage level, a gate, and a drain, wherein the gate of the first PMOS transistor is connected to the drain of the second PMOS transistor and the gate of the second PMOS transistor is connected to the drain of the first PMOS transistor;
an inverter inverting the input signal to generate an inverted input signal;
second and fourth negative metal-oxide semiconductor (NMOS) transistors, each having a source connected to ground and a drain, wherein the second NMOS transistor has a gate receiving the input signal and the fourth NMOS transistor has a gate receiving the inverted input signal; and a switching portion having one side connected to the respective drains of the first and second PMOS transistors and another side connected to the respective drains of the second and fourth NMOS transistors and adapted to perform a switching operation to generate the first level shifting signal with the third voltage level or ground based on the respective voltage levels of the pair of control signals.

6. The level shifting circuit of claim 5, wherein the pair of control signals comprises first and second control signals, and the switching portion comprises:

a third PMOS transistor having a gate receiving the second control signal, a source connected to the drain of the first PMOS transistor, and a drain;

a first NMOS transistor having a gate receiving the first control signal, a drain connected to the drain of the third PMOS transistor, and a source connected to the drain of the second NMOS transistor;

a fourth PMOS transistor having a gate receiving the second control signal, a source connected to the drain of the second PMOS transistor, and a drain; and a third NMOS transistor having a gate receiving the first control signal, a drain connected to the drain of the fourth PMOS transistor, and a source connected to the drain of the fourth NMOS transistor;

wherein the first level shifting signal is apparent at the drain of the first NMOS transistor.

7. The level shifting circuit of claim 4, wherein the second level shifter comprises:

first and second positive metal-oxide semiconductor (PMOS) transistors, each having a source receiving the second voltage level, a gate, and a drain, wherein the gate of the first PMOS transistor is connected to the drain of the second PMOS transistor and the gate of the second PMOS transistor is connected to the drain of the first PMOS transistor;

an inverter inverting the input signal to generate an inverted input signal;

second and fourth negative metal-oxide semiconductor (NMOS) transistors, each having a source connected to ground and a drain, wherein the second NMOS transistor has a gate receiving the input signal and the fourth NMOS transistor has a gate receiving the inverted input signal; and a switching portion having one side connected to the respective drains of the first and second PMOS transistors and another side connected to the respective drains of the second and fourth NMOS transistors and adapted to perform a switching operation to generate the second level shifting signal with the second voltage level or ground based on the respective voltage levels of the pair of control signals.

8. The level shifting circuit of claim 7, wherein the pair of control signals comprises first and second control signals, and the switching portion comprises:

a third PMOS transistor having a gate receiving the second control signal, a source connected to the drain of the first PMOS transistor, and a drain;

a first NMOS transistor having a gate receiving the first control signal, a drain connected to the drain of the third PMOS transistor, and a source connected to the drain of the second NMOS transistor;

a fourth PMOS transistor having a gate receiving the second control signal, a source connected to the drain of the second PMOS transistor, and a drain; and a third NMOS transistor having a gate receiving the first control signal, a drain connected to the drain of the fourth PMOS transistor, and a source connected to the drain of the fourth NMOS transistor;

wherein the first level shifting signal is apparent at the drain of the first NMOS transistor.

9. The level shifting circuit of claim 4, wherein the first level shifter comprises:

a first positive metal-oxide semiconductor (PMOS) transistor having a first terminal receiving the third voltage level, a second terminal, and a gate;

a second PMOS transistor having a first terminal connected to the second terminal of the first PMOS transistor, a second terminal, and a gate receiving a second one of the pair of control signals;

a first negative metal-oxide semiconductor (NMOS) transistor having a first terminal connected to the second terminal of the second PMOS transistor, a second terminal, and a gate receiving a first one of the pair of control signals;

a second NMOS transistor having a first terminal connected to the second terminal of the first NMOS transistor, a second terminal connected to ground, and a gate receiving the input signal;

an inverter receiving the input signal and outputting an inverted input signal;

a third PMOS transistor having a first terminal receiving the third voltage, a second terminal connected to the gate of the first PMOS transistor, and a gate connected to the second terminal of the first PMOS transistor;

a fourth PMOS transistor having a first terminal connected to the second terminal of the third PMOS transistor, a second terminal, and a gate receiving the second one of the pair of control signals;

a third NMOS transistor having a first terminal connected to the second terminal of the fourth PMOS transistor, a second terminal, and a gate receiving the first one of the pair of control signals;

a fourth NMOS transistor having a first terminal connected to the second terminal of the third NMOS transistor, a second terminal connected to ground, and a gate receiving the inverted input signal;

wherein the first level shifting signal is apparent at the second terminal of the second PMOS transistor.

10. The level shifting circuit of claim 4, wherein the second level shifter comprises:

a first positive metal-oxide semiconductor (PMOS) transistor having a first terminal receiving the second voltage level, a second terminal, and a gate;

a second PMOS transistor having a first terminal connected to the second terminal of the first PMOS transistor, a second terminal, and a gate receiving a first one of the pair of control signals;

a first negative metal-oxide semiconductor (NMOS) transistor having a first terminal connected to the second terminal of the second PMOS transistor, a second terminal, and a gate receiving a second one of the pair of control signals;

a second NMOS transistor having a first terminal connected to the second terminal of the first NMOS transistor, a second terminal connected to ground, and a gate receiving the input signal;

an inverter receiving the input signal and outputting an inverted input signal;

a third PMOS transistor having a first terminal receiving the second voltage level, a second terminal connected to the gate of the first PMOS transistor, and a gate connected to the second terminal of the first PMOS transistor;

a fourth PMOS transistor having a first terminal connected to the second terminal of the third PMOS transistor, a second terminal, and a gate receiving the first one of the pair of control signals;

a third NMOS transistor having a first terminal connected to the second terminal of the fourth PMOS transistor, a second terminal, and a gate receiving the second one of the pair of control signals;

a fourth NMOS transistor having a first terminal connected to the second terminal of the third NMOS transistor, a second terminal connected to ground, and a gate receiving the inverted input signal;

wherein the second level shifting signal is apparent at the second terminal of the second PMOS transistor.

11. The level shifting circuit of claim 1, wherein the driving portion comprises:

a first driving circuit adapted to drive the output signal with the third voltage level in response to the pair of control signals; and a second driving circuit adapted to drive the output signal with the second voltage level in response to the pair of control signals.

12. The level shifting circuit of claim 11, wherein the first driving circuit comprises:

a first positive metal-oxide semiconductor (PMOS) transistor having a first terminal receiving the third voltage level, a gate receiving the level shifter output signal, and a second terminal;

a first NMOS transistor having a first terminal, a gate receiving the level shifter output signal, and a second terminal connected to ground; and a switching portion having one side connected to the second terminal of the first PMOS transistor and another side connected to the first terminal of the first NMOS transistor and adapted to perform a switching operation to drive the output signal with the third voltage level or ground in response to the pair of control signals and the level shifter output signal.

13. The level shifting circuit of claim 12, wherein the switching portion comprises:

a second PMOS transistor having a first terminal connected to the second terminal of the first PMOS transistor, a gate receiving a second one of the control signals, and a second terminal; and a second NMOS transistor having a first terminal connected to the second terminal of the second PMOS transistor, a gate receiving a first one of the control signals, and a second terminal;

wherein the output signal is apparent at the second terminal of the second PMOS transistor.

14. The level shifting circuit of claim 11, wherein the second driving circuit comprises:

a first positive metal-oxide semiconductor (PMOS) transistor having a first terminal receiving the second voltage level, a gate receiving the level shifter output signal, and a second terminal;

a first NMOS transistor having a first terminal, a gate receiving the level shifter output signal, and a second terminal connected to ground; and a switching portion having one side connected to the second terminal of the first PMOS transistor and another side connected to the first terminal of the first NMOS transistor and adapted to perform a switching operation to drive the output signal with the second voltage level or ground in response to the pair of control signals and the level shifter output signal.

15. The level shifting circuit of claim 14, wherein the switching portion comprises:

a second PMOS transistor having a first terminal connected to the second terminal of the first PMOS transistor, a gate receiving a first one of the control signals, and a second terminal; and a second NMOS transistor having a first terminal connected to the second terminal of the second PMOS transistor, a gate receiving a second one of the control signals, and a second terminal;

wherein the output signal is apparent at the second terminal of the second PMOS transistor.

16. A level shifting circuit for a semiconductor device, comprising:

a controller adapted to level shift a power converting input signal having a first voltage level to generate a pair of control signals having different logic levels from each other, wherein one of the pair of control signals has a second voltage level that is different from the first level;

a mode register adapted to store one or more bits corresponding to an operating mode of the semiconductor device, wherein the operating mode is established in relation to a mode setting signal input to the semiconductor device from an external source, and the voltage level of the power converting input signal is controlled in relation to the one or more bits;

a level shifting portion adapted to level shift an input signal having the first voltage level to generate a level shifter output signal having the second voltage level or a third voltage level depending on the respective logic levels of the pair of control signals; and a driving portion adapted to drive an output signal with the second or third voltage level based on the voltage level of the level shifter output signal.

* * * * *